(12) United States Patent
Liu et al.

(10) Patent No.: US 11,915,969 B2
(45) Date of Patent: Feb. 27, 2024

(54) SEMICONDUCTOR STRUCTURE AND MANUFACTURING METHOD THEREOF

(71) Applicant: Powerchip Semiconductor Manufacturing Corporation, Hsinchu (TW)

(72) Inventors: Chen-Chiang Liu, Hsinchu County (TW); Hung-Kwei Liao, Taoyuan (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 172 days.

(21) Appl. No.: 17/687,663

(22) Filed: Mar. 6, 2022

(65) Prior Publication Data

US 2023/0238270 A1    Jul. 27, 2023

(30) Foreign Application Priority Data

Jan. 21, 2022   (TW) .................. 111102699

(51) Int. Cl.

| H01L 21/762 | (2006.01) |
|---|---|
| H01L 23/373 | (2006.01) |
| H01L 27/082 | (2006.01) |
| H01L 21/763 | (2006.01) |
| H01L 27/12 | (2006.01) |

(52) U.S. Cl.
CPC .... *H01L 21/76224* (2013.01); *H01L 23/3736* (2013.01); *H01L 21/763* (2013.01); *H01L 27/082* (2013.01); *H01L 27/1203* (2013.01)

(58) Field of Classification Search
CPC ........... H01L 21/76224; H01L 23/3736; H01L 27/082; H01L 21/76229; H01L 21/76232; H01L 21/76283; H01L 21/823481; H01L 23/3677; H01L 27/0823; H01L 23/367; H01L 23/373; H01L 27/1203; H01L 21/763

See application file for complete search history.

(56) References Cited

U.S. PATENT DOCUMENTS

| 6,288,426 B1 * | 9/2001 | Gauthier, Jr. ......... H01L 21/763 257/524 |
|---|---|---|
| 9,922,962 B2 | 3/2018 | Chou et al. |
| 2003/0122215 A1 * | 7/2003 | Wilson .............. H01L 21/76264 257/E23.105 |
| 2013/0099308 A1 * | 4/2013 | Gruber .................. H01L 23/481 257/330 |

(Continued)

OTHER PUBLICATIONS

"Office Action of Taiwan Counterpart Application", dated Jul. 14, 2022, p. 1-p. 6.

(Continued)

*Primary Examiner* — Patricia D Valenzuela
(74) *Attorney, Agent, or Firm* — JCIPRNET

(57) ABSTRACT

A semiconductor structure including a substrate and a deep trench isolation structure is provided. The deep trench isolation structure is disposed in the substrate and is not electrically connected to any device. The deep trench isolation structure includes a heat dissipation layer and a dielectric liner layer. The heat dissipation layer is disposed in the substrate. The dielectric liner layer is disposed between the heat dissipation layer and the substrate.

18 Claims, 3 Drawing Sheets

(56) References Cited

U.S. PATENT DOCUMENTS

2015/0056777 A1    2/2015  Dahlstrom et al.
2020/0235029 A1*   7/2020  Verma ................ H01L 23/3736
2021/0043534 A1    2/2021  Verma et al.

OTHER PUBLICATIONS

Joel Hruska, "TSMC Mulls On-Chip Water-Cooling for Future High-Performance Silicon", retrieved on Mar. 1, 2022, Available at: https://www.extremetech.com/computing/324625-tsmc-mulls-on-chip-water-cooling-for-future-high-performance-silicon#comments.

* cited by examiner

SEMICONDUCTOR STRUCTURE AND MANUFACTURING METHOD THEREOF

CROSS-REFERENCE TO RELATED APPLICATION

This application claims the priority benefit of Taiwan application serial no. 111102699, filed on Jan. 21, 2022. The entirety of the above-mentioned patent application is hereby incorporated by reference herein and made a part of this specification.

BACKGROUND OF THE INVENTION

Field of the Invention

The invention relates to a semiconductor structure and a manufacturing method thereof, and particularly relates to a semiconductor structure having a deep trench isolation (DTI) structure and a manufacturing method thereof.

Description of Related Art

In the current semiconductor structure, the deep trench isolation structure is often used to isolate semiconductor devices. Due to the low thermal conductivity of the material of the current deep trench isolation structure, the deep trench isolation structure will hinder heat dissipation. In addition, as the operating frequency and/or device density of the semiconductor device (e.g., transistor device) are/is getting higher and higher, the temperature of the semiconductor device during operation is also getting higher and higher. Therefore, if the deep trench isolation structure hinders the heat dissipation of the semiconductor device, the performance and lifetime of the semiconductor device will be reduced.

SUMMARY OF THE INVENTION

The invention provides a semiconductor structure and a manufacturing method thereof, which are beneficial to the heat dissipation of the semiconductor device.

The invention provides a semiconductor structure, which includes a substrate and a deep trench isolation structure. The deep trench isolation structure is disposed in the substrate and is not electrically connected to any device. The deep trench isolation structure includes a heat dissipation layer and a dielectric liner layer. The heat dissipation layer is disposed in the substrate. The dielectric liner layer is disposed between the heat dissipation layer and the substrate.

According to an embodiment of the invention, in the semiconductor structure, the deep trench isolation structure does not penetrate through the substrate.

According to an embodiment of the invention, in the semiconductor structure, the thermal conductivity of the heat dissipation layer may be greater than the thermal conductivity of silicon dioxide.

According to an embodiment of the invention, in the semiconductor structure, the thermal conductivity of the heat dissipation layer may be greater than the thermal conductivity of silicon.

According to an embodiment of the invention, in the semiconductor structure, the material of the heat dissipation layer is, for example, metal.

According to an embodiment of the invention, in the semiconductor structure, the cross-sectional shape of the dielectric liner layer may be a U-shape.

According to an embodiment of the invention, the semiconductor structure may further include a semiconductor device. The semiconductor device is located on the substrate or in the substrate or is located on the substrate and in the substrate.

According to an embodiment of the invention, in the semiconductor structure, the semiconductor device may be an active device.

According to an embodiment of the invention, in the semiconductor structure, the active device may be a transistor device.

According to an embodiment of the invention, in the semiconductor structure, the deep trench isolation structure may be a continuous structure surrounding the semiconductor device.

According to an embodiment of the invention, the semiconductor structure may further include a shallow trench isolation (STI) structure. The shallow trench isolation structure is disposed in the substrate. A shallow trench isolation structure may surround the semiconductor device.

According to an embodiment of the invention, in the semiconductor structure, the deep trench isolation structure may surround the shallow trench isolation structure.

According to an embodiment of the invention, the semiconductor structure may further include a dielectric layer. The dielectric layer covers the semiconductor device.

According to an embodiment of the invention, in the semiconductor structure, the deep trench isolation structure may extend into the dielectric layer.

According to an embodiment of the invention, in the semiconductor structure, the deep trench isolation structure may penetrate through the dielectric layer.

According to an embodiment of the invention, in the semiconductor structure, the dielectric liner layer may be further disposed between the heat dissipation layer and the dielectric layer.

According to an embodiment of the invention, the semiconductor structure may further include a heat sink and an interconnect structure. The heat sink is disposed on the heat dissipation layer. The interconnect structure is disposed between the heat sink and the heat dissipation layer.

According to an embodiment of the invention, in the semiconductor structure, the interconnect structure may be in direct contact with the heat sink and the heat dissipation layer.

The invention provides a manufacturing method of a semiconductor structure, which is used to form the semiconductor structure and includes the following steps. A semiconductor device is formed. The semiconductor device is located on the substrate or in the substrate or is located on the substrate and in the substrate. After the semiconductor device is formed, the deep trench isolation structure is formed in the substrate.

According to an embodiment of the invention, in the manufacturing method of the semiconductor structure, the method of forming the deep trench isolation structure may include the following steps. A dielectric layer covering the semiconductor device is formed. The deep trench isolation structure is formed in the dielectric layer and the substrate.

Based on the above description, in the semiconductor structure according to the invention, the deep trench isolation structure includes the heat dissipation layer and the dielectric liner layer, and the heat dissipation layer has a high thermal conductivity. Therefore, the deep trench isolation structure of the invention can reduce the obstruction to the heat dissipation path of the semiconductor device and is beneficial to the heat dissipation of the semiconductor device. In this way, in the semiconductor structure according to the invention, the deep trench isolation structure can have both the isolation function and the heat dissipation function, thereby improving the performance and lifetime of the semiconductor device. In addition, in the manufacturing method of the semiconductor structure according to the invention, since the semiconductor device is formed first, and then the deep trench isolation structure is formed, the process complexity can be reduced.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

Figure 1:
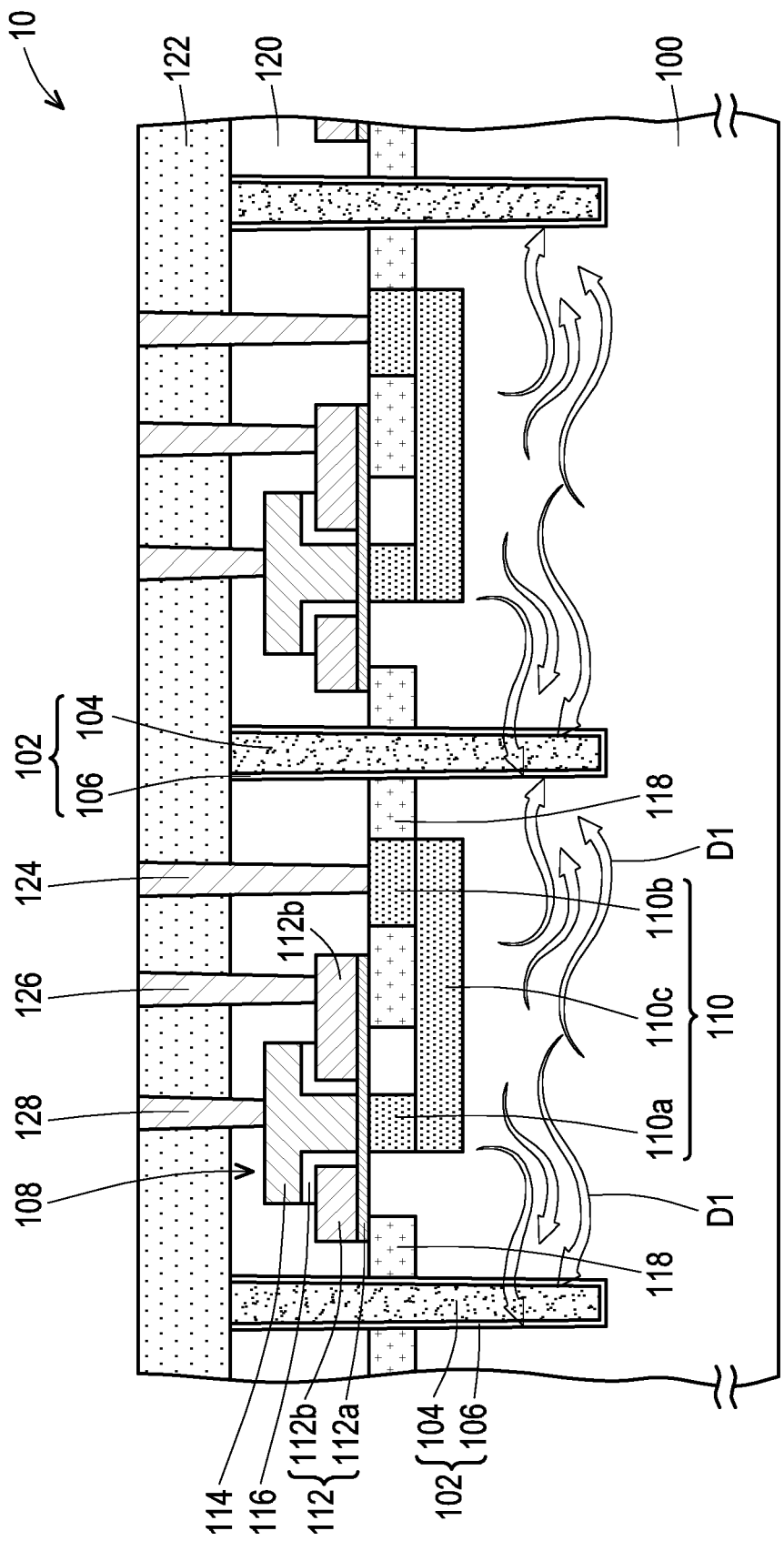
FIG. 1 is a cross-sectional view illustrating a semiconductor structure according to some embodiments of the invention.
Figure 2:
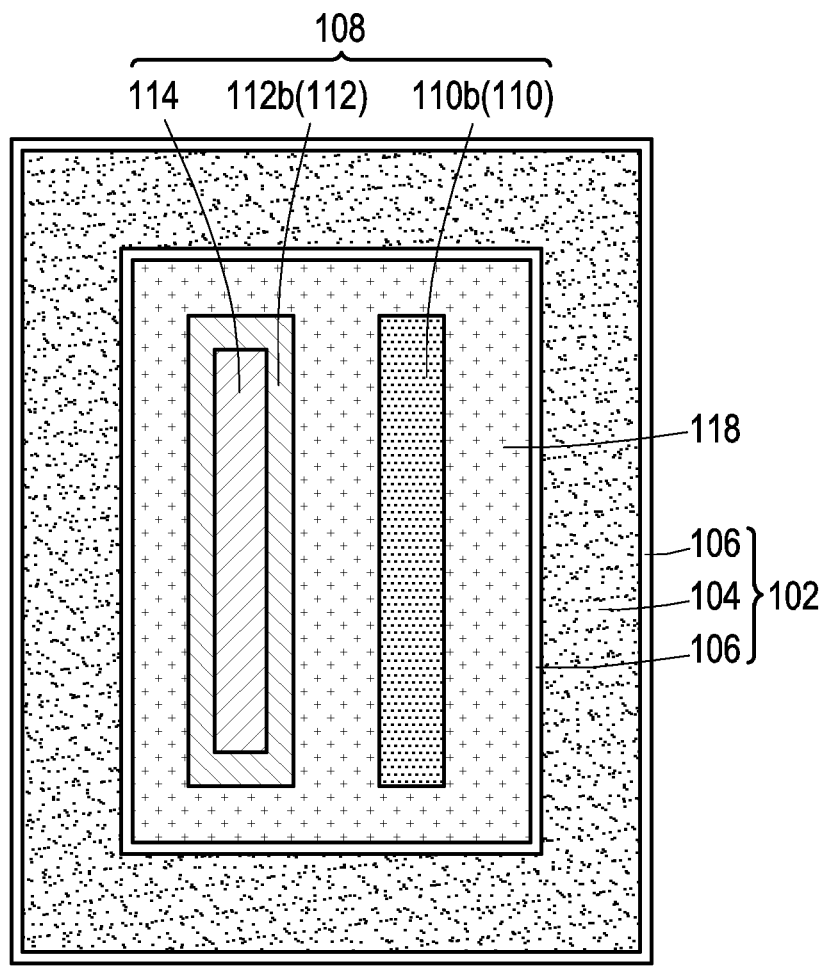
FIG. 2 is a partial top view of the semiconductor structure of FIG. 1.

FIG. 1 is a cross-sectional view illustrating a semiconductor structure according to some embodiments of the invention. FIG. 2 is a partial top view of the semiconductor structure of FIG. 1. In the top view of the present embodiment, some components in the cross-sectional view are omitted to clearly illustrate the configuration relationship between the components in the top view.

Referring to FIG. 1 and FIG. 2, a semiconductor structure 10 includes a substrate 100 and a deep trench isolation structure 102. The substrate 100 may be a semiconductor substrate such as a silicon substrate, but the invention is not limited thereto. The deep trench isolation structure 102 is disposed in the substrate 100 and is not electrically connected to any device. That is, in the present embodiment, the function of the deep trench isolation structure 102 is not used for electrical connection.

The deep trench isolation structure 102 includes a heat dissipation layer 104 and a dielectric liner layer 106. In some embodiments, the deep trench isolation structure 102 does not penetrate through the substrate 100. The heat dissipation layer 104 is disposed in the substrate 100. In some embodiments, the thermal conductivity of the heat dissipation layer 104 may be greater than the thermal conductivity of silicon dioxide. In some embodiments, the thermal conductivity of the heat dissipation layer 104 may be greater than the thermal conductivity of silicon. The material of the heat dissipation layer 104 is not limited to metal or non-metal. In some embodiments, the material of the heat dissipation layer 104 may be metal (e.g., copper), but the invention is not limited thereto.

The dielectric liner layer 106 is disposed between the heat dissipation layer 104 and the substrate 100. The dielectric liner layer 106 may be disposed between the sidewall of the heat dissipation layer 104 and the substrate 100 and between the bottom surface of the heat dissipation layer 104 and the substrate 100. In some embodiments, the cross-sectional shape of the dielectric liner layer 106 may be a U-shape. The material of the dielectric liner layer 106 is, for example, silicon oxide.

The semiconductor structure 10 may further include a semiconductor device 108. The semiconductor device 108 is located on the substrate 100 or in the substrate 100 or is located on the substrate 100 and in the substrate 100. In the present embodiment, the semiconductor device 108 is located on the substrate 100 and in the substrate 100, for example, but the invention is not limited thereto. In some embodiments, the semiconductor device 108 may be an active device. In some embodiments, the active device may be a transistor device. In the present embodiment, the semiconductor device 108 is, for example, a SiGe heterojunction bipolar transistor (HBT), but the invention is not limited thereto.

In the present embodiment, the semiconductor device 108 may include a collector 110, a base 112, and an emitter 114. The collector 110 and the emitter 114 may have a first conductive type (e.g., N-type), and the base 112 may have a second conductive type (e.g., P-type). Hereinafter, the first conductive type and the second conductive type may be one and the other of the N-type conductive type and the P-type conductive type respectively. In the present embodiment, the first conductive type is, for example, the N-type conductive type, and the second conductive type is, for example, the P-type conductive type, but the invention is not limited thereto. In other embodiments, the first conductive type may be the P-type conductive type, and the second conductive type may be the N-type conductive type.

The collector 110 is disposed in the substrate 100. In some embodiments, the collector 110 may include a doped region 110a, a doped region 110b, and a doped region 110c. The doped region 110a, the doped region 110b, and the doped region 110c may have the first conductive type (e.g., N-type). In some embodiments, the doped region 110a may be a selectively implanted collector (SIC). The doped region 110a and the doped region 110b are disposed in the substrate 100 separately. The doped region 110c is connected to the doped region 110a and the doped region 110b.

The base 112 is disposed on the substrate 100. In some embodiments, the base 112 may include a conductive layer 112a and a conductive layer 112b. The conductive layer 112a and the conductive layer 112b may have a second conductive type (e.g., P type). The conductive layer 112a is disposed on the substrate 100 and may be connected to the doped region 110a of the collector 110. The material of the conductive layer 112a is, for example, silicon-germanium (SiGe). The conductive layer 112b is disposed on the conductive layer 112a. The material of the conductive layer 112b is, for example, doped polysilicon.

The emitter 114 is disposed on the base 112. The emitter 114 may be connected to the conductive layer 112a of the base 112. A portion of the emitter 114 may be disposed on a portion of the conductive layer 112b. In some embodiments, the conductive layer 112b of the base 112 may surround the emitter 114 (FIG. 2). The material of the emitter 114 is, for example, doped polysilicon. Furthermore, the semiconductor structure 10 may further include an isolation layer 116. The isolation layer 116 is disposed between the emitter 114 and the conductive layer 112b. The material of the isolation layer 116 is, for example, silicon nitride.

In the present embodiment, the deep trench isolation structure 102 may be a continuous structure surrounding the semiconductor device 108, that is, the top-view shape of the deep trench isolation structure 102 may include a ring shape (FIG. 2), but the invention is not limited thereto. The top-view shape of the deep trench isolation structure 102 may be adjusted according to the product requirement. For example, in other embodiments, the top-view shape of the deep trench isolation structure 102 may be a sheet shape or a column shape.

The semiconductor structure 10 may further include a shallow trench isolation structure 118. The shallow trench isolation structure 118 is disposed in the substrate 100. The shallow trench isolation structure 118 may surround semiconductor device 108 (FIG. 2). The deep trench isolation structure 102 may surround the shallow trench isolation structure 118 (FIG. 2). The material of the shallow trench isolation structure 118 is, for example, silicon oxide.

The semiconductor structure 10 may further include a dielectric layer 120. The dielectric layer 120 covers the semiconductor device 108. The deep trench isolation structure 102 may extend into the dielectric layer 120. The deep trench isolation structure 102 may penetrate through the dielectric layer 120. The dielectric liner layer 106 may be further disposed between the heat dissipation layer 104 and the dielectric layer 120. The material of the dielectric layer 120 is, for example, silicon oxide.

The semiconductor structure 10 may further include a dielectric layer 122. The dielectric layer 122 is disposed on the dielectric layer 120 and the deep trench isolation structure 102. The material of the dielectric layer 122 is, for example, silicon oxide.

The semiconductor structure 10 may further include an interconnect structure 124, an interconnect structure 126, and an interconnect structure 128. The interconnect structure 124, the interconnect structure 126, and the interconnect structure 128 may be disposed in the dielectric layer 120 and the dielectric layer 122. The top portion of the interconnect structure 124, the top portion of the interconnect structure 126, and the top portion of the interconnect structure 128 may be pads. The interconnect structure 124 may be electrically connected to the collector 110. The interconnect structure 126 may be electrically connected to the base 112. The interconnect structure 128 may be electrically connected to the emitter 114. In the present embodiment, the interconnect structure 124, the interconnect structure 126, and the interconnect structure 128 may respectively include a contact, but the invention is not limited thereto. In other embodiments, the interconnect structure 124, the interconnect structure 126, and the interconnect structure 128 may respectively include a contact, a conductive line, a via, or a combination thereof. The materials of the interconnect structure 124, the interconnect structure 126, and the interconnect structure 128 are, for example, metal such as tungsten, aluminum, copper, or a combination thereof, but the invention is not limited thereto.

In some embodiments, the manufacturing method of the semiconductor structure 10 may include the following steps. The semiconductor device 108 is formed. The semiconductor device 108 is located on the substrate 100 or in the substrate 100 or is located on the substrate 100 and in the substrate 100. In the present embodiment, the semiconductor device 108 is located on the substrate 100 and in the substrate 100, for example, but the invention is not limited thereto. After the semiconductor device 108 is formed, the deep trench isolation structure 102 is formed in the substrate 100. In some embodiments, the method of forming the deep trench isolation structure 102 may include the following steps. First, the dielectric layer 120 covering the semiconductor device 108 is formed. Next, the deep trench isolation structure 102 is formed in the dielectric layer 120 and the substrate 100. The deep trench isolation structure 102 may penetrate through the dielectric layer 120. For example, the method of forming the heat dissipation layer 104 and the dielectric liner layer 106 may include the following steps. First, a trench (not shown) may be formed in the dielectric layer 120 and the substrate 100. Next, a dielectric liner material layer (not shown) and a heat dissipation material layer (not shown) filling into the trench may be sequentially formed. The method of forming the heat dissipation material layer is, for example, an electrochemical deposition method, but the invention is not limited thereto. Then, the heat dissipation material layer and the dielectric liner material layer located outside the trench may be removed by a chemical mechanical polishing method to form the heat dissipation layer 104 and the dielectric liner layer 106. Moreover, the formation methods of other components in the semiconductor structure 10 are well known to one of ordinary skill in the art, and the description thereof is omitted here.

Based on the above embodiments, in the semiconductor structure 10, the deep trench isolation structure 102 includes the heat dissipation layer 104 and the dielectric liner layer 106, and the heat dissipation layer 104 has a high thermal conductivity. Therefore, the deep trench isolation structure 102 of the invention can reduce the obstruction to the heat dissipation path of the semiconductor device 108 and is beneficial to the heat dissipation of the semiconductor device 108. For example, as shown in FIG. 1, the semiconductor device 108 can perform lateral heat dissipation through the substrate 100 and the deep trench isolation structure 102 along the heat dissipation direction D1. In this way, in the semiconductor structure 10, the deep trench isolation structure 102 can have both the isolation function and the heat dissipation function, thereby improving the performance and lifetime of the semiconductor device 108. In addition, in the manufacturing method of the semiconductor structure 10 of the above embodiments, since the semiconductor device 108 is formed first, and then the deep trench isolation structure 102 is formed, the process complexity can be reduced.

Figure 3:
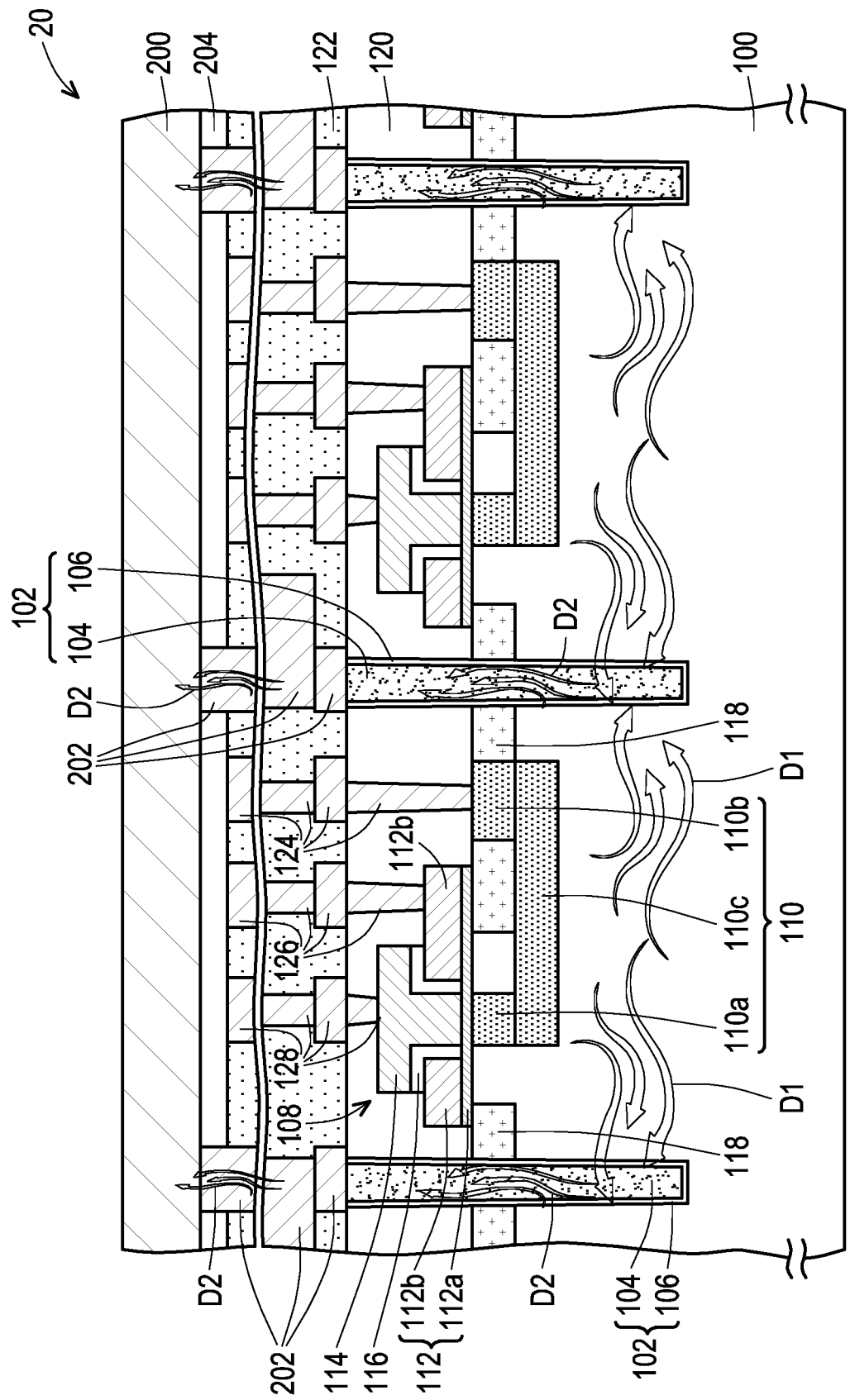
FIG. 3 is a cross-sectional view illustrating a semiconductor structure according to other embodiments of the invention.

FIG. 3 is a cross-sectional view illustrating a semiconductor structure according to other embodiments of the invention.

Referring to FIG. 1 and FIG. 3, the difference between the semiconductor structure 20 of FIG. 3 and the semiconductor structure 10 of FIG. 1 is described as follows. In FIG. 3, the semiconductor structure 20 may further include a heat sink 200 and an interconnect structure 202. The heat sink 200 is disposed on the heat dissipation layer 104. The material of the heat sink 200 is, for example, metal, but the invention is not limited thereto. The interconnect structure 202 is disposed between the heat sink 200 and the heat dissipation layer 104. The interconnect structure 202 may be in direct contact with the heat sink 200 and the heat dissipation layer 104. The interconnect structure 202 is disposed in the dielectric layer 122. In the present embodiment, the interconnect structure 202, the interconnect structure 124, the interconnect structure 126, and the interconnect structure 128 may respectively include a contact, a conductive line, a via, or a combination thereof. The material of the interconnect structure 202 is, for example, metal such as tungsten, aluminum, copper, or a combination thereof, but the invention is not limited thereto.

Furthermore, the semiconductor structure 20 may further include a dielectric layer 204. The dielectric layer 204 is disposed between the heat sink 200 and the dielectric layer 122. The interconnect structure 202 may penetrate through the dielectric layer 204 to connect to the heat sink 200. In some embodiments, there may be components (not shown) required for the package structure in the dielectric layer 204, and the description thereof is omitted here.

Moreover, the same components in the semiconductor structure 20 and the semiconductor structure 10 are denoted by the same symbols, and the same or similar content in the semiconductor structure 20 and the semiconductor structure 10 may be referred to the description of the semiconductor structure 10 in the foregoing embodiment, and the description thereof is omitted here.

Based on the above embodiments, in the semiconductor structure 20, since the heat dissipation layer 104 can be connected to the heat sink 200 through the interconnect structure 202, the semiconductor device 108 can dissipate heat through the heat sink 200. For example, as shown in FIG. 2, the semiconductor device 108 can perform vertical heat dissipation through the heat dissipation layer 104, the interconnect structure 202, and the heat sink 200 along the heat dissipation direction D2, thereby further improving the heat dissipation capability of the semiconductor structure 20. That is, in the semiconductor structure 20, the semiconductor device 108 may perform lateral heat dissipation along the heat dissipation direction D1 and may perform vertical heat dissipation along the heat dissipation direction D2. In this way, in the semiconductor structure 20, the deep trench isolation structure 102 can have both the isolation function and the heat dissipation function, thereby improving the performance and lifetime of the semiconductor device 108. In addition, in the manufacturing method of the semiconductor structure 20 of the above embodiments, since the semiconductor device 108 is formed first, and then the deep trench isolation structure 102 is formed, the process complexity can be reduced.

In summary, in the semiconductor structure of the aforementioned embodiments, the deep trench isolation structure includes the heat dissipation layer and the dielectric liner layer, and the heat dissipation layer has a high thermal conductivity. Therefore, the deep trench isolation structure of the invention can reduce the obstruction to the heat dissipation path of the semiconductor device and is beneficial to the heat dissipation of the semiconductor device. In this way, in the semiconductor structure of the aforementioned embodiments, the deep trench isolation structure can have both the isolation function and the heat dissipation function, thereby improving the performance and lifetime of the semiconductor device. In addition, in the manufacturing method of the semiconductor structure of the aforementioned embodiments, since the semiconductor device is formed first, and then the deep trench isolation structure is formed, the process complexity can be reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
   a substrate;
   a deep trench isolation structure disposed in the substrate and not electrically connected to any device, wherein the deep trench isolation structure comprises:
      a heat dissipation layer disposed in the substrate; and
      a dielectric liner layer disposed between the heat dissipation layer and the substrate;
   a heat sink disposed on the heat dissipation layer; and
   an interconnect structure disposed between the heat sink and the heat dissipation layer, wherein the interconnect structure is in direct and physical contact with the heat sink and the heat dissipation layer.

2. The semiconductor structure according to claim 1, wherein the deep trench isolation structure does not penetrate through the substrate.

3. The semiconductor structure according to claim 1, wherein a thermal conductivity of the heat dissipation layer is greater than a thermal conductivity of silicon dioxide.

4. The semiconductor structure according to claim 1, wherein a thermal conductivity of the heat dissipation layer is greater than a thermal conductivity of silicon.

5. The semiconductor structure according to claim 1, wherein a material of the heat dissipation layer comprises metal.

6. The semiconductor structure according to claim 1, wherein a cross-sectional shape of the dielectric liner layer comprises a U-shape.

7. The semiconductor structure according to claim 1, further comprising:
   a semiconductor device located on the substrate or in the substrate or located on the substrate and in the substrate.

8. The semiconductor structure according to claim 7, wherein the semiconductor device comprises an active device.

9. The semiconductor structure according to claim 8, wherein the active device comprises a transistor device.

10. The semiconductor structure according to claim 7, wherein the deep trench isolation structure is a continuous structure surrounding the semiconductor device.

11. The semiconductor structure according to claim 7, further comprising:
    a shallow trench isolation structure disposed in the substrate and surrounding the semiconductor device.

12. The semiconductor structure according to claim 11, wherein the deep trench isolation structure surrounds the shallow trench isolation structure.

13. The semiconductor structure according to claim 7, further comprising:
    a dielectric layer covering the semiconductor device.

14. The semiconductor structure according to claim 13, wherein the deep trench isolation structure extends into the dielectric layer.

15. The semiconductor structure according to claim 13, wherein the deep trench isolation structure penetrates through the dielectric layer.

16. The semiconductor structure according to claim 13, wherein the dielectric liner layer is further disposed between the heat dissipation layer and the dielectric layer.

17. A manufacturing method of a semiconductor structure, used to form the semiconductor structure according to claim 1 and comprising:
- forming a semiconductor device, wherein the semiconductor device is located on the substrate or in the substrate or is located on the substrate and in the substrate; and
- after forming the semiconductor device, forming the deep trench isolation structure in the substrate.

18. The manufacturing method of the semiconductor structure according to claim 17, wherein a method of forming the deep trench isolation structure comprises:
- forming a dielectric layer covering the semiconductor device; and
- forming the deep trench isolation structure in the dielectric layer and the substrate.

* * * * *